United States Patent
Lee et al.

(10) Patent No.: US 7,521,704 B2
(45) Date of Patent: Apr. 21, 2009

(54) MEMORY DEVICE USING MULTI-LAYER WITH A GRADED RESISTANCE CHANGE

(75) Inventors: Myoung-jae Lee, Gyeonggi-do (KR); In-kyeong Yoo, Gyeonggi-do (KR); Sun-ae Seo, Gyeonggi-do (KR); Dong-seok Suh, Seoul (KR); David Seo, Gyeonggi-do (KR); Sang-hun Jeon, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 194 days.

(21) Appl. No.: 11/116,332

(22) Filed: Apr. 28, 2005

(65) Prior Publication Data
US 2005/0247921 A1  Nov. 10, 2005

(30) Foreign Application Priority Data
Apr. 28, 2004  (KR) .................. 10-2004-0029675

(51) Int. Cl.
*H01L 29/02* (2006.01)
(52) U.S. Cl. .................. 257/2; 438/102; 438/103; 257/3; 257/4; 257/5
(58) Field of Classification Search ........... 257/2–5, 257/337; 438/3, 800
See application file for complete search history.

(56) References Cited

U.S. PATENT DOCUMENTS

| | | | |
|---|---|---|---|
| 3,761,896 A | 9/1973 | Davidson | |
| 5,099,302 A * | 3/1992 | Pavlin | 257/337 |
| 5,640,343 A * | 6/1997 | Gallagher et al. | 365/171 |
| 5,751,012 A | 5/1998 | Wolstenholme et al. | |
| 6,151,241 A | 11/2000 | Hayashi et al. | |
| 6,358,756 B1 * | 3/2002 | Sandhu et al. | 438/3 |
| 6,436,757 B1 | 8/2002 | Kitamura | |
| 6,487,110 B2 | 11/2002 | Nishimura et al. | |
| 6,522,573 B2 * | 2/2003 | Saito et al. | 365/158 |
| 6,590,244 B2 | 7/2003 | Asao et al. | |
| 6,815,744 B1 | 11/2004 | Beck et al. | |
| 2002/0036917 A1 | 3/2002 | Nishimura et al. | |

(Continued)

FOREIGN PATENT DOCUMENTS

CN  1340213 A  3/2002

(Continued)

OTHER PUBLICATIONS

Influence of barrier impurities on the magnetoresistance in ferromagnetic tunnel junctions by R. Jansen and J.S. Moodera, Journal of Applied Physics, vol. 83, No. 11, Jun. 1998, pp. 6682-6684.*

(Continued)

*Primary Examiner*—Jerome Jackson, Jr.
*Assistant Examiner*—Jami M Valentine
(74) *Attorney, Agent, or Firm*—Buchanan Ingersoll & Rooney PC (57) ABSTRACT

A memory device using a multi-layer with a graded resistance change is provided. The memory device includes: a lower electrode; a data storage layer being located on the lower electrode and having the graded resistance change; and an upper electrode being located on the data storage layer.

13 Claims, 4 Drawing Sheets

U.S. PATENT DOCUMENTS

| | | |
|---|---|---|
| 2002/0063274 A1 | 5/2002 | Kanaya et al. |
| 2002/0079526 A1 | 6/2002 | Fukuda et al. |
| 2003/0048666 A1* | 3/2003 | Eldridge et al. ........ 365/185.28 |
| 2003/0156467 A1 | 8/2003 | Gilton et al. |
| 2003/0189851 A1 | 10/2003 | Brandenberger et al. |
| 2004/0113192 A1 | 6/2004 | Wicker |
| 2004/0245557 A1 | 12/2004 | Seo et al. |
| 2005/0247921 A1 | 11/2005 | Lee et al. |
| 2007/0114587 A1 | 5/2007 | Seo et al. |
| 2007/0132049 A1 | 6/2007 | Stipe |

FOREIGN PATENT DOCUMENTS

| | | |
|---|---|---|
| CN | 1450561 A | 10/2003 |
| EP | 1 355 356 A2 | 10/2003 |
| JP | 62-042582 A | 2/1987 |
| KR | 1019950021133 | 7/1995 |
| KR | 1020030034500 A | 5/2003 |

OTHER PUBLICATIONS

Korean Office Action dated Jun. 26, 2007 (with English Translation).
Jansen, R., et al., "Influence of barrier impurities on the magnetoresistance in ferromagnetic tunnel junctions," Journal of Applied Physics, Jun. 1, 1998, pp. 6682-6684, vol. 83, No. 11, American Institute of Physics, NY, USA.
Chinese Official Action dated Oct. 18, 2007 (with English translation).
Chinese Office Action for Application No. 2005100684384, dated Mar. 21, 2008 and its English translation.

* cited by examiner

MEMORY DEVICE USING MULTI-LAYER WITH A GRADED RESISTANCE CHANGE

BACKGROUND OF THE INVENTION

Priority is claimed to Korean Patent Application No. 10-2004-0029675, filed on Apr. 28, 2004, in the Korean Intellectual Property Office, the disclosure of which is incorporated herein in its entirety by reference.

Field of the Invention

The present invention relates to a memory device using a multi-layer material with a graded resistance change, and more particularly, to a nonvolatile memory device using a multi-layered resistance change material or a multi-layered resistance change film with a graded resistance change, and a method thereof.

Description of the Related Art

Semiconductor memory device has been developed for the purpose of a large number of memory cells per unit area (high integration), a high operation speed and lower power driving. A various memory devices are being developed.

The semiconductor memory device generally includes many memory cells having a circuit connection. In the case of Dynamic Random Access Memory (DRAM), a unit memory cell generally includes one transistor and one capacitor. The DRAM has an advantage of the high integration and the high operation speed, but is a volatile memory in which all data are erased after power is turned-off.

A typical example of the nonvolatile memory device is a flash memory in which the stored data can be preserved even after the power is turned-off. The flash memory has a non-volatile characteristic unlike the DRAM, but has a low integration and a low operation speed in comparison with the DRAM.

As a present nonvolatile memory device being much studied, there are Magnetic Random Access Memory (MRAM), Ferroelectric Random Access Memory (FRAM), Phase-change Random Access Memory (PRAM) and the like. The MRAM stores data by using a change of a magnetization direction in a tunnel junction. The FRAM stores data by using a polarization characteristic of ferroelectric substance. The PRAM stores data by using a phase change of a specific material. All of them have respective advantages and disadvantages, but are being developed for the high integration, the high operation speed, the low power driving and a good data retention.

SUMMARY OF THE INVENTION

The present invention provides a newly structured nonvolatile semiconductor memory device using a resistance change in which a multi-layer material with a graded resistance that changes over a thickness of the multi-layered material is used to perform low power driving and high-speed operation.

According to an aspect of the present invention, there is provided a memory device using a multi-layer material with a graded resistance change, the device including: a lower electrode; a data storage layer being located on the lower electrode and having the graded resistance that changes over a thickness of the data storage layer; and an upper electrode being located on the data storage layer.

The data storage layer may have a resistance layer containing a transition metal material.

The data storage layer may include: a first resistance layer being located on the lower electrode; a second resistance layer being located on the first resistance layer, and having the transition metal material; and a third resistance layer being located on the second resistance layer.

The second resistance layer may have a larger resistance value than the first resistance layer and the third resistance layer.

The data storage layer may include: the first resistance layer being located on the lower electrode and having the transition metal material; and the second resistance layer being located on the first resistance layer, and having a lower resistance value than the first resistance layer.

The data storage layer may include: the first resistance layer being located on the lower electrode; and the second resistance layer being located on the first resistance layer and having the transition metal material, and having a larger resistance value than the first resistance layer.

The transition metal material may be selected from the group consisting of nickel, titanium, hafnium, niobium, zinc, tungsten and cobalt.

According to another aspect of the present invention, there is provided a memory device using a multi-layer with a graded resistance change, the device including: a semiconductor substrate; a first impurity region and a second impurity region being located in the semiconductor substrate; a gate oxide film and a gate electrode layer being sequentially located on the semiconductor substrate to be in contact with the first impurity region and the second impurity region; a lower electrode being located on the second impurity region to be electrically connected with the second impurity region; a data storage layer being located on the lower electrode, and having the graded resistance that changes over a thickness of the data storage layer; and an upper electrode located on the data storage layer.

The data storage layer may be located to have a resistance layer containing the transition metal material.

The transition metal material may be selected from the group consisting of nickel, titanium, hafnium, niobium, zinc, tungsten and cobalt.

According to another aspect of the present invention, there is provided a memory device using a multi-layer with a graded resistance change, the device including: a semiconductor substrate; a diode being located on the semiconductor substrate and having a switching function; and a data storage layer being connected to the diode, and having the graded resistance that changes over a thickness of the data storage layer.

The data storage layer may be formed to have a resistance layer containing a transition metal material with content being varied.

The transition metal material may be selected from the group consisting of nickel, titanium, hafnium, niobium, zinc, tungsten and cobalt.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1A:
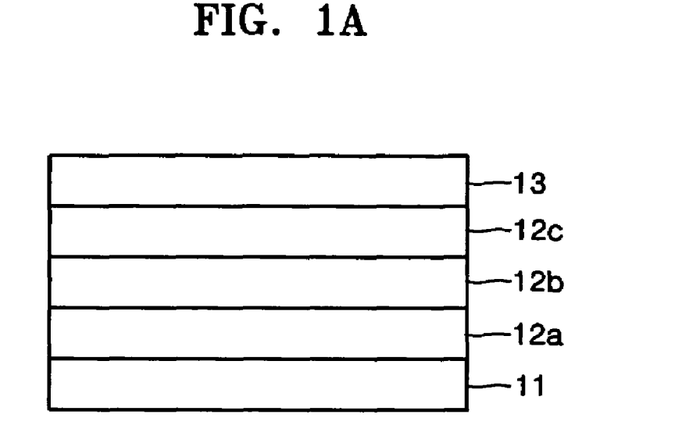
FIGS. 1A through 1C are views illustrating multi-layer materials with graded resistance changes according to exemplary embodiments of the present invention.
Figure 1B:
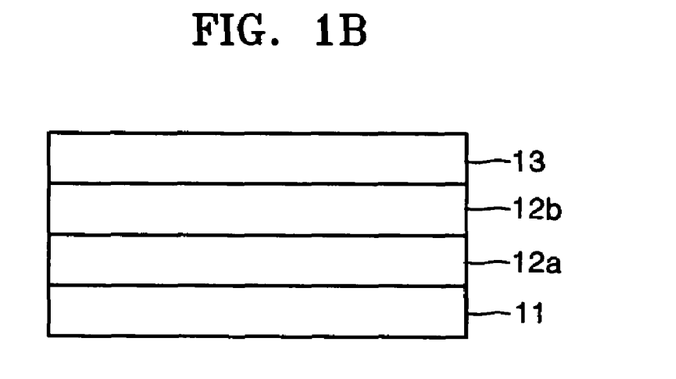
Figure 1C:
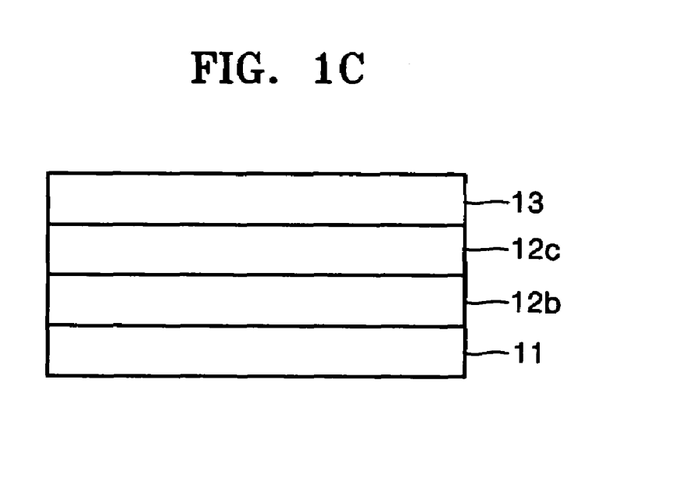

FIGS. 1A through 1C are views illustrating multi-layers with graded resistance changes according to embodiments of the present invention.

Referring to FIG. 1A, a multi-layered structure is formed to have a first resistance layer 12a having a resistance value R1, a second resistance layer 12b having a resistance value R2, and a third resistance layer 12c having a resistance value R3, which are sequentially layered on a lower electrode 11. Additionally, an upper electrode 13 is formed on the third resistance layer 12c.

Here, the lower electrode 11 and the upper electrode 13 generally use a conductive material, which can be used as an electrode material of a semiconductor device, for example, as a metal material. Particularly, the lower electrode 11 can be selectively determined depending on a kind of material formed thereon. A multi-layer (resistant body) with the graded resistance change (variable resistance) is formed on the lower electrode 11. The first resistance layer 12a, the second resistance layer 12b and the third resistance layer 12c basically use an insulating material having a low electrical conductivity. The present invention is characterized in that the multi-layer with the graded resistance change is formed between the lower electrode 11 and the upper electrode 13. Here, the resistance values R1 and R2 of the first resistance layer 12a and the second resistance layer 12b are different from each other, and the resistance values R2 and R3 of the second resistance layer 12b and the third resistance layer 12c are different from each other.

In an embodiment of FIG. 1A, the resistance value R2 of the second resistance layer 12b may be larger than the resistance values R1 and R3 of the first resistance layer 12a and the third resistance layer 12c (R2>R1, R3). Additionally, the second resistance layer 12b having a relatively high resistance value R2 may be formed of material containing a transition metal (for example, a transition metal oxide). The transition metal oxide is a nickel oxide (NiO), a titanium oxide ($TiO_2$), a hafnium oxide (HfO), a niobium oxide ($NbO_2$), a zinc oxide (ZnO), a tungsten oxide ($WO_3$), and a cobalt oxide (CoO), for example.

The first resistance layer 12a and the third resistance layer 12c can use the same transition metal oxide as the second resistance layer 12b, but can be formed of other insulating materials. In case where the first resistance layer 12a and the third resistance layer 12c use the transition metal oxide, they have a resistance value lower than the resistance value R2 of the second resistance layer 12b. The first resistance layer 12a, the second resistance layer 12b and the third resistance layer 12c are arranged as follows.

First, the second resistance layer 12b is formed including the transition metal material, and may be formed of the transition metal oxide.

Second, the first resistance layer 12a and the third resistance layer 12c are formed of an insulating material having a lower resistance value than the resistance value R2 of the second resistance layer 12b.

Third, like the second resistance layer 12b, the first resistance layer 12a and the third resistance layer 12c can be also formed of the transition metal oxide, but are formed to have a lower resistance value than the resistance value of the second resistance layer 12b.

For reference, the first resistance layer 12a, the second resistance layer 12b and the third resistance layer 12c can be also formed of the same transition metal oxide. However, the second resistance layer 12b is also formed to have the resistance value R2 higher than the resistance values R1 and R3 of the first resistance layer 12a and the third resistance layer 12c. For example, in case where the nickel oxide is used as one of the transition metal oxide, if a concentration of oxygen is controlled, even the same material has a different resistance value depending on a concentration distribution of oxygen. Accordingly, a multi-layer material with the graded resistance change is formed using the above characteristic.

Unlike FIG. 1A, FIGS. 1B and 1C are views illustrating the multi-layers with the graded resistance changes having the two resistance layers. However, it should be noted that the resistance layer 12b, which is formed of the transition metal oxide, represents a resistance layer region containing the transition metal having a higher resistance value than those of other resistance layers in the multi-layer with the graded resistance change.

The multi-layer material with the graded resistance change according to embodiments of the present invention can be easily manufactured using a general semiconductor technique. In case where the first resistance layer 12a, the second resistance layer 12b and the third resistance layer 12c can be formed of the same transition metal oxide (for example, the nickel oxide), an amount of oxygen can be suitably controlled such that the multi-layer material is consecutively formed to have different resistance values in a direction of thickness.

Figure 2:
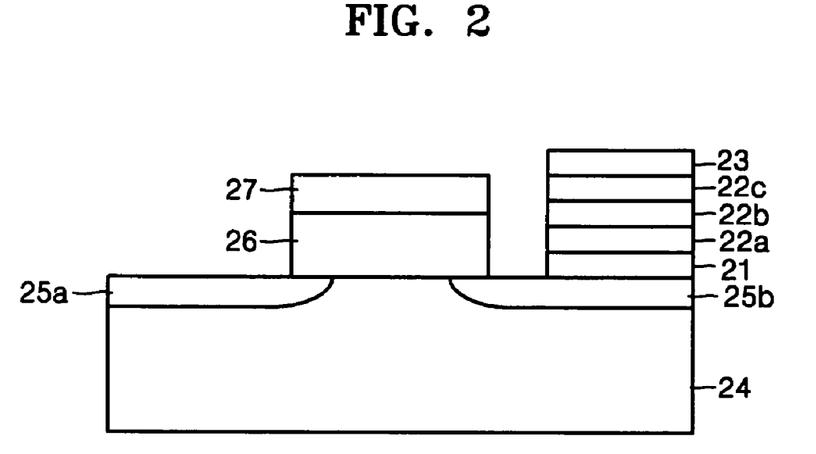
FIG. 2 is a view illustrating an example of a transistor structure to which a memory device using a multi-layer with a graded resistance change is applied.

In order to embody the multi-layer material with the graded resistance change as the memory device according to the embodiment of the present invention, the multi-layer material connected with a transistor structure having a switching function is illustrated in an embodiment of FIG. 2. Here, a diode can be used as a switching device excepting the transistor.

Referring to FIG. 2, a first impurity region 25a and a second impurity region 25b having predetermined doped impurities are formed at both sides of a portion of a semiconductor substrate 24. A channel region (without a reference number) is formed in the semiconductor substrate 24 between the first impurity region 25a and the second impurity region 25b. A gate insulating layer 26 and a gate electrode layer 27 are formed on the channel region. The multi-layer material with the graded resistance change can be directly formed on the first impurity region 25a (e.g., source) and/or the second impurity region 25b (e.g., drain). FIG. 2 illustrates the multi-layer material connected on the second impurity region 25b.

A lower electrode 21 is formed on the second impurity region 25b. The first resistance layer 22a, the second resistance layer 22b and the third resistance layer 22c are sequentially formed, correspondingly to FIG. 1A, on the lower electrode 21 to form a variable resistance structure. An upper electrode 23 is formed on the third resistance layer 22c. FIG. 2 illustrates the multi-layer material with the graded resistance change directly formed on the second impurity region 25b to include the lower electrode 21. However, it should be noted that a connection structure through the substrate 24 to the second impurity region 25b and the conductive plug (not shown) can be formed in FIG. 2.

The memory device of FIG. 2 has a 1T-1R structure including one resistance in one transistor, and the multi-layer structure 22a, 22b and 22c (corresponding to 12a, 12b and 12c in FIG. 1A, as described above) is a data storage layer. The above-structured memory device can be easily manufactured on the basis of a general manufacture process of the semiconductor memory device.

The description of an exemplary fabrication method is as follows.

First, a gate insulating layer 26 and a gate electrode layer 27 are sequentially deposited on the semiconductor substrate 24. Both sides of the gate insulating layer 26 and the gate electrode layer 27 are removed to expose both side upper portions of the semiconductor substrate 24. Next, predetermined impurities are doped, using implantation, at both sides of the exposed semiconductor substrate 24. By doing so, the first impurity region 25a and the second impurity region 25b are formed, thereby completing a transistor structure. Additionally, an interlayer insulating layer (not shown) can be deposited on the transistor structure. The second impurity region 25b is exposed. The lower electrode 21, the first resistance layer 22a, the second resistance layer 22b, the third resistance layer 22c, and the upper electrode 23 are sequentially formed on the exposed second impurity region 25b such that the memory device of the 1T-1R structure can be manufactured as shown in FIG. 2.

Hereinafter, an operation characteristic of the memory device using the multi-layer material with the graded resistance change according to an exemplary embodiment of the present invention is described in detail with reference to the attached drawings.

Figure 3A:
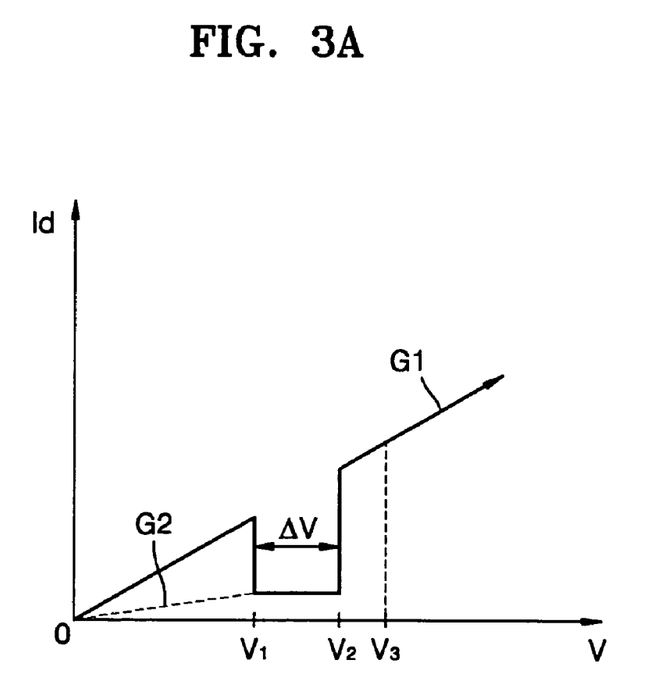
FIG. 3A is a graph illustrating a voltage-current characteristic of a multi-layer material with a graded resistance change shown in FIGS. 1A through 1C.

FIG. 3A is a graph illustrating an electrical characteristic of the multi-layer with the graded resistance change in which the resistance layers 22a, 22b and 22c are formed using the nickel oxide. A horizontal axis represents a voltage applied to the resistance layers 22a, 22b and 22c, and a vertical axis represents a current flowing in the resistance layer with respect to the applied voltage.

Referring to FIG. 3A, in the case of the memory device using the multi-layer material with the graded resistance change according to an exemplary embodiment of the present invention, two operation characteristics are shown.

First, if a zero voltage applied to the resistance layers 22a, 22b and 22c is gradually increased, the current is increased in proportion to the applied voltage. However, if the voltage of more than $V_1$ is applied, the resistance is rapidly increased to decrease the current. Additionally, if the voltage of more than $V_2(V_2>V_1)$ is applied, the resistance is rapidly decreased to increase the current, thereby again following a graph $G_1$.

Alternatively, the electrical characteristic of the resistance layers 22a, 22b and 22c depending on the voltage larger than $V_1$ applied thereto influences an electrical characteristic when a voltage of less than $V_1$ is subsequently applied. This is described in detail as follows.

First, in case where a voltage of $V_1$ to $V_2$ is applied to the resistance layers 22a, 22b and 22c and then, the voltage of less than $V_1$ is again applied to the resistance layers 22a, 22b and 22c, the current is measured following a graph G2 of FIG. 3A. Additionally, in case where a voltage ($V_3$) larger than $V_2$ is applied to the resistance layers 22a, 22b and22c, and then, a voltage of less than $V_1$ is again applied to the resistance layers 22a, 22b and 22c, the current is measured following the graph G1 of FIG. 3A. By this, it can be appreciated that the electrical characteristic remains without disappearance to influence the resistance layers 22a, 22b and 22c in dependence upon a magnitude (a voltage of $V_1$ to $V_2$ or a voltage of more than $V_2$) of the voltage of more than $V_1$.

Accordingly, the transition metal oxide can be employed in the resistance layers 22a, 22b and 22c to apply the multi-layer with the graded resistance change to the nonvolatile memory device. That is, in case where the voltage of $V_1$ to $V_2$ of FIG. 3A is applied, the resistance layers 22a, 22b and 22c are designated to be in a state of '0', and in case where the voltage larger than $V_2$ is applied, the resistance layers 22a, 22b and 22 are designated to be in a state of '1', thereby recording data. In case where data is reproduced, the voltage of less than $V_1$ is applied to measure a drain current (Id), thereby identifying whether or not data stored in the resistance layers 22a, 22b and 22c are in a state of '0' or '1'. Of course, the state of '1' or '0' is selectively designated.

Figure 3B:
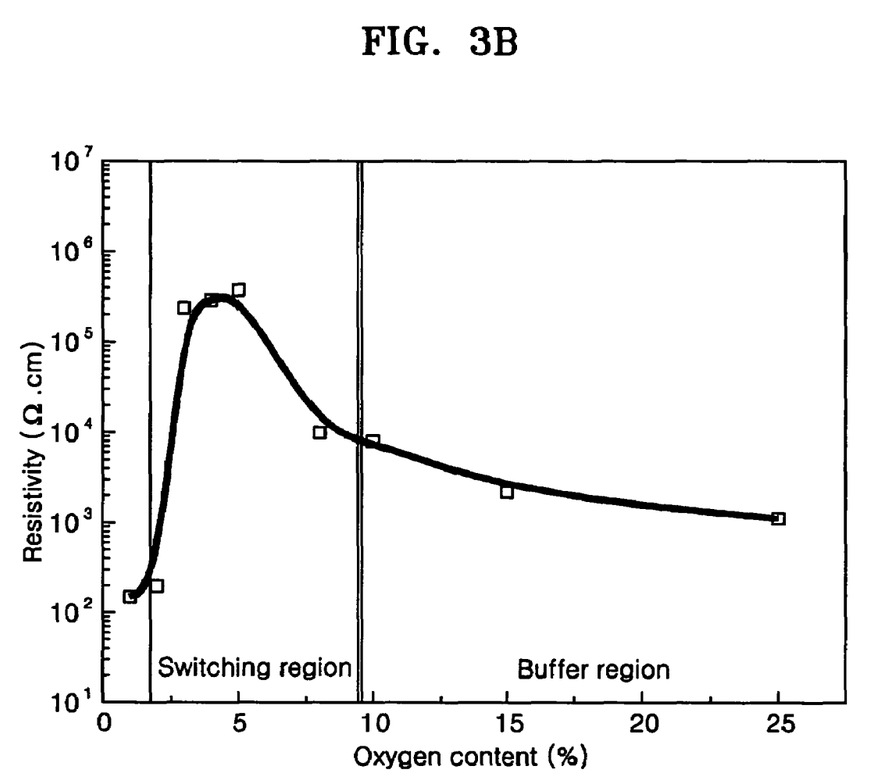
FIG. 3B is a graph illustrating a resistance change of a nickel oxide depending on a weight percent of oxygen ($O_2$), in a nickel oxide used for a multi-layer according to a preferred embodiment of the present invention.

FIG. 3B is a graph illustrating the graded resistance change of the nickel oxide depending on a content (wt %) of oxygen ($O_2$) of the nickel oxide (NiO) used for the multi-layer material as shown in FIG. 2. As described above, the first resistance layer 22a, the second resistance layer 22b and the third resistance layer 22c, which constitute the multi-layer material with the graded resistance change of FIG. 2, can be formed of the same transition metal oxide having a varied content of oxygen. Since the resistance characteristic of the transition metal oxide is different depending on the content of oxygen, the oxygen content of the resistance layers 22a, 22b and 22c should be controlled to represent the electrical characteristic as in FIG. 3A.

Referring to FIG. 3B, a region (switching region) having the oxygen content of about 2 to 9.5 wt % has the resistance value of the nickel oxide, which is larger than those of other regions (buffer region), and has the electrical characteristic represented as in FIG. 3A. Accordingly, in the region having the oxygen content of about 2 to 9.5 wt %, the nickel oxide is used as the second resistance layer 22b. Additionally, other nickel oxides having the oxygen content may be used as the first resistance layer 22a and the third resistance layer 22c. Of course, the first resistance layer 22a and the third resistance layer 22c can be formed of other insulating materials than the transition metal oxide. They can be applied to the multi-layer material with the graded resistance change according to the embodiment of the present invention.

Figure 4A:
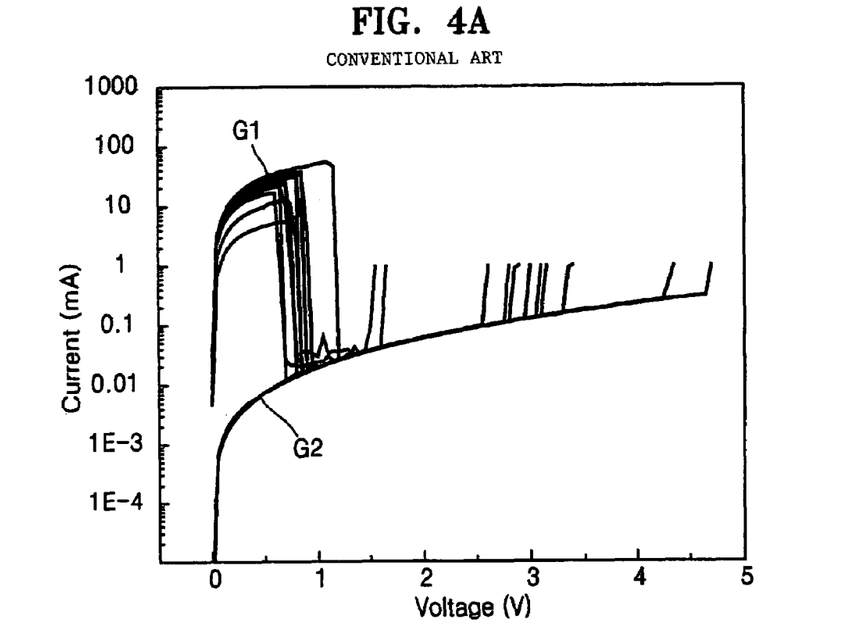
FIG. 4A is a graph illustrating an operation characteristic of a memory device having a single-layered film with a single regular resistance distribution.
Figure 4B:
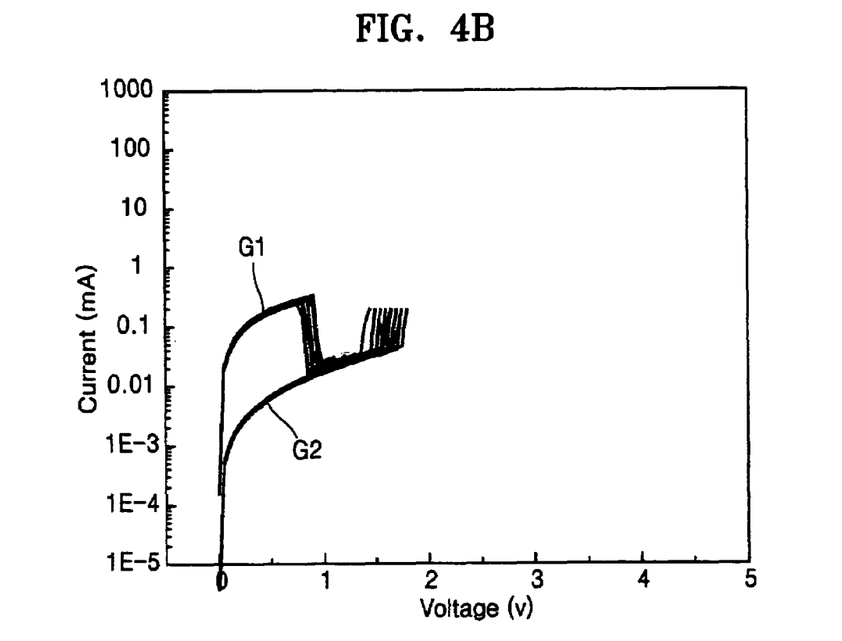
FIG. 4B is a graph illustrating an operation characteristic of a memory device having a multi-layer with a graded resistance change according to an embodiment of the present invention.

FIGS. 4A and 4B are graphs illustrating a comparison of electrical characteristics of a memory device having a single resistance layer and a memory device having a multi-layer with the graded resistance change according to an embodiment of the present invention.

A horizontal axis represents the magnitude (V) of the voltage applied to the resistance layer, and a vertical axis represents the current measured in the resistance layer. Since the electrical characteristic of FIG. 3A is represented even in the memory device having a single-layered transition metal oxide without the graded resistance change, it can function as a memory device. However, in case where the multi-layer with the graded resistance change is used, a stable switching characteristic can be obtained such that the memory device has a more excellent characteristic.

FIG. 4A illustrates the electrical characteristic of the memory device using the single resistance layer. In FIG. 4A, the nickel oxide corresponding to the switching region of FIG. 3B is formed between the lower electrode and the upper electrode. Referring to FIG. 4A, it can be appreciated that it is difficult to specify magnitudes of mutually varied voltages ($V_1$ and $V_2$ of FIG. 3A) by using the graphs G1 and G2. Additionally, a region ($\Delta V$) corresponding to a difference ($V_2$–$V_1$) between $V_1$ and $V_2$ of FIG. 3A can be set, but is not so large.

FIG. 4B illustrates the electrical characteristic of the memory device with the graded resistance change according to the embodiment of the present invention.

Here, the first resistance layer 22a and the third resistance layer 22c of an experimental specimen are formed of the nickel oxide with the oxygen content corresponding to the buffer region of FIG. 3B, and the second resistance layer 22b is formed of the nickel oxide with the oxygen content corresponding to the switching region of FIG. 3B. Additionally, the first resistance layer 22a, the second resistance layer 22b and the third resistance layer 22c are formed to have the same thickness of about 50 mm.

Referring to FIG. 4B, it can be appreciated that the magnitudes of the mutually varied voltages ($V_1$ and $V_2$ of FIG. 3A) can be easily specified using the graphs G1 and G2. Additionally, the region ($\Delta V$) corresponding to the difference ($V_2$–$V_1$) between $V_1$ and $V_2$ of FIG. 3A can be easily set. Additionally, since the inventive memory device can operate at a relatively lower voltage and current region, low power driving can be performed.

As described above, embodiments of the present invention provide a non-volatile semiconductor device with the new structure of 1T-1R or 1D-1R. Since embodiments of the present invention can use a widely used semiconductor process such as a conventional DRAM manufacture process as it is, manufacture can be easily implemented and productivity can be enhanced. Further, embodiments of the present invention have an advantage in that, since the operational change in resistance characteristic of the multi-layer material with the graded resistance is used to store and reproduce information, integration can be enhanced with a high-speed operation characteristic and a lower power driving.

While the present invention has been particularly shown and described with reference to exemplary embodiments thereof, it will be understood by those of ordinary skill in the art that various changes in form and details may be made therein without departing from the spirit and scope of the present invention as defined by the following claims.

For example, the present invention provides the multi-layer material of two or three layers with the graded resistance changes, but can include multiple layers with the graded resistance changes. Further, the inventive memory device provides the multi-layer material with the graded resistance change connected with the transistor, but it is obvious that the multi-layer material can be connected with a diode, which can serve as another switching device, to be used as the memory device of 1D-1R form.

What is claimed is:

1. A memory device using a multi-layered structure with a graded resistance change, the device comprising:
   a semiconductor substrate;
   a first impurity region and a second impurity region located in the semiconductor substrate;
   a gate oxide film and a gate electrode layer sequentially located on the semiconductor substrate to be in contact with the first impurity region and the second impurity region;
   a lower electrode located on the second impurity region to be electrically connected with the second impurity region;
   a data storage layer located on the lower electrode, and having the graded resistance that changes in resistance over a thickness of the data storage layer; and
   an upper electrode located on the data storage layer,
   wherein the data storage layer comprises a first resistance layer on the lower electrode and a second resistance layer on the first resistance layer, and
   wherein data is stored as one of a plurality of resistance states of the data storage layer.

2. The device of claim 1, wherein the data storage layer comprises a first resistance layer and a second resistance layer containing a transition metal oxide material.

3. The device of claim 2, wherein the transition metal of the transition metal oxide material is selected from the group consisting of nickel, titanium, hafnium, niobium, zinc, tungsten and cobalt.

4. A memory device using a multi-layered structure with a graded resistance change, the device comprising:
   a semiconductor substrate;
   a diode located on the semiconductor substrate and having a switching function; and
   a data storage layer connected to the diode, and having a graded resistance that changes resistance over a thickness of the data storage layer,
   wherein the data storage layer comprises a plurality of resistance layers formed of a transition metal oxide material with oxygen content being varied, and
   wherein the graded resistance is set in accordance with a resistance of each resistance layer.

5. The device of claim 4, wherein the data storage layer comprises a first resistance layer and a second resistance layer containing the transition metal material.

6. The device of claim 5, wherein the transition metal of the transition metal oxide material is selected from the group consisting of nickel, titanium, hafnium, niobium, zinc, tungsten and cobalt.

7. The device of claim 1,
   wherein a first resistance state of the data storage layer represents a first binary value and a second resistance state represents a second binary value, resistance values of the first and second resistance states both being greater than zero and less than infinite,
   wherein upon application of a first writing voltage between the lower and upper electrodes, a total resistance of the data storage layer is at the first resistance state, and
   wherein upon application of a second writing voltage between the lower and upper electrodes, the total resistance of the data storage layer is at the second resistance state.

8. The device of claim 1, wherein the lower electrode is in contact with the second impurity region.

9. The device of claim 2, wherein resistances of the first and second resistance layers are different from each other based on respective material compositions of the first and second resistance layers.

10. The device of claim 2,
    wherein the first resistance layer is located on the lower electrode, and the second resistance layer is located on the first resistance layer, and
    wherein data is stored as one of a plurality of resistance states of the data storage layer.

11. The device of claim 4,
    wherein a first resistance state represents a first binary value and a second resistance state represents a second binary value, resistance values of the first and second resistance states both being greater than zero and less than infinite, wherein upon application of a first writing voltage to the data storage layer, a total resistance of the data storage layer is at the first resistance state, and wherein upon application of a second writing voltage to the data storage layer, the total resistance of the data storage layer is at the second resistance state.

12. The device of claim 5, wherein resistances of the first and second resistance layers are different from each other based on respective material compositions of the first and second resistance layers.

13. The device of claim 5, wherein the first resistance layer is located on the lower electrode, and the second resistance layer is located on the first resistance layer, and wherein data is stored as one of a plurality of resistance states of the data storage layer.

* * * * *